United States Patent [19]

Thuren et al.

[11] Patent Number: 5,635,976

[45] Date of Patent: Jun. 3, 1997

[54] METHOD AND APPARATUS FOR THE PRODUCTION OF A STRUCTURE BY FOCUSED LASER RADIATION ON A PHOTOSENSITIVELY COATED SUBSTRATE

[75] Inventors: Anders Thuren, Täby; Torjbörn Sandström, Mölnlycke, both of Sweden

[73] Assignee: Micronic Laser Systems AB, Täby, Sweden

[21] Appl. No.: 369,059

[22] Filed: Jan. 5, 1995

Related U.S. Application Data

[63] Continuation-in-part of Ser. No. 731,610, Jul. 17, 1991, abandoned.

[51] Int. Cl.$^6$ .................................................. H04N 1/21
[52] U.S. Cl. ................................. 347/253; 358/298
[58] Field of Search .............................. 347/253, 240, 347/131; 358/296, 298, 300, 302

[56] References Cited

U.S. PATENT DOCUMENTS

| | | |
|---|---|---|
| 3,925,785 | 12/1975 | Firtion et al. . |
| 4,090,206 | 5/1978 | Pfeifer et al. . |
| 4,209,240 | 6/1980 | Sutherland et al. . |
| 4,240,119 | 12/1980 | Norton et al. . |
| 4,404,569 | 9/1983 | Neumann et al. . |
| 4,541,712 | 9/1985 | Whitney . |
| 4,549,222 | 10/1985 | Fogaroli et al. . |
| 4,571,635 | 2/1986 | Mahmoodi et al. . |
| 4,796,038 | 1/1989 | Allen et al. . |
| 4,835,545 | 5/1989 | Mager et al. . |
| 4,867,542 | 9/1989 | Shimazu et al. . |
| 4,879,605 | 11/1989 | Warkentin et al. . |
| 4,887,225 | 12/1989 | Yao . |
| 4,896,169 | 1/1990 | Kuwabara et al. . |
| 4,907,282 | 3/1990 | Daly et al. . |
| 5,053,619 | 10/1991 | Arimoto . |
| 5,107,345 | 4/1992 | Lee . |
| 5,113,266 | 5/1992 | Sugiura . |
| 5,115,328 | 5/1992 | Kadono . |

FOREIGN PATENT DOCUMENTS

| | | |
|---|---|---|
| 467076 | 6/1991 | European Pat. Off. . |
| 2159364 | 11/1985 | United Kingdom . |
| 2215553 | 5/1988 | United Kingdom . |

OTHER PUBLICATIONS

400 Solid State Technology, 30, (1987) Aug., No. 8, Port Washington, NY, USA; "Laser Technology in Photolithography".

SPIE vol. 200 Laser Recording and Information Handling (1979)/179–86, Joseph P. Donahue, EOCOM Corporation, Irvine, California, "Laser pattern generator for printed circuit board artwork generation".

*Primary Examiner*—Mark Reinhart
*Attorney, Agent, or Firm*—Keck, Mahin & Cate

[57] ABSTRACT

A system for writing geometric structures on a photosensitive substrate including a modulated laser beam source, a focusing lens, a deflector for producing a scanning action between the light source and the lens, and a device for mechanically moving the surface relative to the laser beam. Compressed data for use in writing the geometric structures is read out of a memory into a data delivery circuit such that the data is formatted to have both beam power and position information. A modulator logic circuit operates to call up the data from the data delivery circuit, form a modulation drive signal based on the power information, and delay the modulation drive signal based the position data. The modulator logic circuit thus operates to vary the modulation drive signal to begin or end exposure along the scan lines with greater resolution or pixel density by at least a factor of four more than the resolution or spacing density between adjacent scan lines. The scan lines are arranged within stripes, and adjacent stripes preferably are made to overlap such that the stripes are blended in the overlap according to a predetermined stepwise changing function.

26 Claims, 10 Drawing Sheets

103

104

METHOD AND APPARATUS FOR THE PRODUCTION OF A STRUCTURE BY FOCUSED LASER RADIATION ON A PHOTOSENSITIVELY COATED SUBSTRATE

RELATED APPLICATIONS

This application is a continuation-in-part of U.S. patent application Ser. No. 07/731,610, now abandoned filed on Jul. 17, 1991.

BACKGROUND OF THE INVENTION

1. Field of the Invention

The invention relates to a surface pattern produced on a photosensitively coated substrate by a focussed laser beam, and a method and an apparatus for producing such a pattern. In particular, the invention is directed to methods and apparatus for producing structures of chromium on glass which are suitable for use as masks or reticles for photolithography in semiconductor production.

2. Description of Related Art

Masks and what are known as reticles with extremely accurate structures of chromium on glass substrates are used for the production of photolithographic structures or patterns in the production of semiconductors. A 5X reticle, that is to say a pattern or structure which is photographically reduced five fold on to the semiconductor wafer and which constitutes the most widespread type of mask in the near future may comprise a quartz plate measuring 150 mm×150 mm which has a structure of opaque chromium. The structure is formed by exposure to light or an electron beam of a photosensitive or electron-sensitive covering on the chromium film. The photosensitive or electron-sensitive covering is then chemically developed and the exposed part thereof is removed. In a subsequent etching operation, the chromium is etched away at the locations at which the covering has been removed and the chromium film which remains forms the pattern or structure.

The smallest line widths of known 5-fold reticles are about 2 microns. However the required level of accuracy is considerably higher. Admissible overlay errors, that is to say the admissible difference between the position of the edges of the chromium in identical reticles produced in two successive steps is to be of the order of magnitude of 0.05 micron.

Reticles are mainly used for the production of accurate structures or patterns in the semiconductor industry. However there are also many other applications, for example in the field of integrated optics, diffraction optics, computer-generated holograms, micro-machining of miniaturized sensors, optical information storage and superconducting devices. Other important applications are direct exposure of patterns on semiconductor wafers and pattern generation for large-area displays. The high costs of existing production equipment for surface patterns or structures with a sufficient degree of accuracy and in particular using electron beam reticle writers represent an obstacle to the development of new equipment in these little established areas, in particular in universities and smaller companies.

A common aspect of all known pattern generators is that the mask or reticle is described in a digital data bank containing a list of all structure or pattern elements with their geometrical data. Before the structures are written, the geometrical data are converted to the format which is used by the writing hardware. During that conversion operation the geometrical co-ordinates are truncated to the addressing resolution of the hardware, that is to say the writing address grid.

An approximation error of 0.25 micron will occur when the address grid is 0.5 microns. This may be acceptable if the structures are designed with this grid in mind and never rescaled. However operations such as for example uniform scaling of a structure by for example 93%, the provision of a process bias or a predetermined process error range, such as an increase in the dimension of all elements in order to compensate for dimensionally inadequate etching during the operating procedure, of for example 0.15 micron, or displacement of the structure or surface pattern by an additional distance, give rise to unpredictable approximation errors which appear in the structure.

An address grid which is sufficiently fine to make the approximation error insignificant is required in order for those operations or process steps to be possible. In addition a finer grid allows the structure to be produced independently of the machine employed, which is used to write the pattern. That is desirable as designing and production of masks take place in different production locations. Preferably the approximation error should be less than 0.05 micron for 5X reticles.

Most modern pattern generators use a raster scan principle with a scanning beam which is either an electron beam or a laser beam and which is deflected along parallel lines on the substrate which is covered with a radiation-sensitive covering. The beam is switched on and off in dependence on a bitmap for the structure, which is stored in the control system. Another option is that the beam is produced during a writing time which is derived from data stored in an intermediate compressed format.

For a pattern or surface structure with an address grid or raster of 0.5 micron, it is possible to produce a bitmap with a bit for each grid point, a digital bit for each pixel, i.e., each individually controllable area element. Normal writing speeds are from 5 through 10 square millimeters per second, which corresponds to a reasonable data rate of from 20 through 40 Mbits per second with a data volume of from 10 through 100 Gigabytes per mask. By means of suitable data compression algorithms it is possible to store the compressed data on a fixed disc and to expand it to the full data volume at the time of writing. In addition the data rate is compatible with commonly used families of integrated circuits and commercially available electro-optical and acousto-optical modulators.

In principle a pattern with an addressability of 0.05 micron could also be written with scan lines at a spacing of 0.05 micron and with a pixel spacing of 0.05 micron along the scan line. However a bitmap with a 0.05 micron grid and a surface cover rate as referred to above corresponds to a data rate of 2–4 Gbits per second. It is not possible to modulate a single writing beam at that rate. In addition the data volume is one hundred times greater than for the 0.5 micron grid and is fairly unmanageable. Even real-time expansion from the compressed data format is impracticable as the flow of data would choke the data buses of most processors. Technological limitations in regard to modulation rate and data flow would severely limit the writing speed and make it impossible to use a reticle writer with a full pixel map with a 0.05 micron address grid.

While it is possible for masks and reticles to be produced by means of an X-Y scanning device, see for example U.S. Pat. No. 4,060,816, that device is too slow for example a practical use in the production of masks.

Simple mechanical scanning in the X- and Y-directions results in an unsuitable throughput, but it is possible to use a sub-scanning principle in order to increase the writing speed, see for example U.S. Pat. No. 4,455,485.

It is possible to produce a finer address grid with a fixed coarse writing grid if the surface is scanned a plurality of times, as for example in British patent specification No. 2,215,553. Successively written grids can be disposed one above the other with a small amount of displacement so as to increase the density of the resulting grid. Another possible way of improving the degree of address resolution involves carrying out the writing operation a plurality of times with a bitmap which is modified on each occasion so that some pixels are written twice while other pixels are written only once. As the focal spot is larger than the spacing between the pixels, exposure is a smooth function which covers the individual pixels. A structure or pattern element has edges from which the exposure increases smoothly from zero to full exposure. The addition of a row of half-intensity pixels has the effect of displacing the intensity profile by half a pixel spacing. Writing a 0.5 micron grid four times, using the original position twice and twice using a position which is displaced by 0.25 micron, gives an effective address grid of 0.125 micron, in accordance with the procedure set forth in above-mentioned British patent specification No. 2,215,553. That gives an effective address grid which is four times smaller than the hardware grid, but that procedure requires four writing passes over the surface.

In video displays, it is possible for picture elements to be positioned at pixel fractions by using what is known as the 'antialiasing' procedure (see IEEG CG+A, January 1981, pages 40 through 48). The image which can be generated from a digital data bank is sampled at fictional sub-pixel positions. The sampled sub-pixel data are smoothed over a plurality of true pixels and the smoothed, that is to say spreadout, data from each sub-pixel are added at the true pixel positions. The eye interprets the resulting blurred transitions as sharp edges and the apparent position of edges can be altered in small fractional pixel increments by modification of the dosage at the pixel locations. Furthermore, run length encoding, often referred to as RLE, is a suitable data compression algorithm for pixel data which contain long sequences of individual values. The volume of the compressed data is a function primarily of the number of transitions from one value to another and back again and depends to a slight degree on the level of bitmap resolution.

SUMMARY OF THE INVENTION

An object of the present invention is to provide a method of producing a surface pattern which can afford a considerable increase in the degree of grid resolution without adversely affecting writing speed and with good edge quality while involving manageable volumes of data.

Another object of the present invention is to provide a method of producing a surface pattern which involves a combination of procedures operable in a simple and reliable fashion to give a highly satisfactory result.

Still another object of the present invention is to provide an apparatus for producing a pattern on a substrate which is reliable in operation and affords a high degree of accuracy.

Additional objects and advantages of the invention will be set forth in and apparent from the description and drawings that follow, as well as will be learned by practice of the invention. Further objects and advantages of the invention also will be realized and attained by the elements of the apparatus and methods particularly pointed out in the appended claims.

In accordance with the principles of the present invention, in a first aspect, the foregoing and other objects are achieved by a method of producing a surface pattern such as a structure for which the position and dimension of fundamental structure forms are controlled in incremental steps which are substantially smaller than the dimension of the smallest fundamental structure form on a substrate. In dependence on a format which specifies the structure and its exposure, a photosensitive layer on the substrate is exposed by means of at least one modulated and focussed laser beam along parallel scan lines arranged at equal spacings from each other, in pixels at equal spacings from each other along the scan lines, with the pixel density in the direction of the scan line being greater by a factor of at least four than the pixel density normal to the scan lines, and position interpolation by intensity modulation in the direction perpendicular to the scan lines.

As will be seen in greater detail hereinafter, the present invention can provide an improvement in the degree of grid resolution by a factor of four and more without adversely affecting the writing speed. The edge deterioration is less than when using a pure antialiasing system and the data volume is of a manageable extent.

In regard to increasing the density of addressing points, it has been found that an increase in the density of the scan lines requires an unacceptable expenditure in terms of writing time. In practice both the scanning speed and also the laser beam modulation frequency are limited. Doubling the scan line density would involve doubling the scanning speed and doubling the number of pixels to be written per second. In contrast thereto a reduction in pixel spacing along the scan lines is easier to make, since with an unchanged minimum feature size the switching frequency of the modulator remains unaffected. The difficulty lies in the greater volume of data for specifying a structure with a denser grid.

In accordance with the invention, in another aspect, the foregoing and other objects are achieved by an apparatus for writing a structure on a photosensitive surface of a substrate comprising at least one source for at least one modulated laser beam, at least one focussing lens for focussing the at least one laser beam on the photosensitive surface, a deflection means for producing a scanning action between the light source and the focussing means, and a mechanical means for movement of the surface relative to the at least one scanning laser beam. A data input means is provided for receiving structure data in a format which specifies geometrical properties of the structure, together with exposure thereof, while a data preparation means provides for conversion of the geometrical data into an intermediate compressed format. The apparatus further includes a digital storage means for holding the compressed converted data for the structure and a data delivery means for preparation of the stored data as an internal data format comprising a pair of data contents, of which one is provided for beam power, referred to herein as power data, while the other is provided for the position at which the beam power is changed, referred to herein as position data. A modulator drive logic means is operable to call up data from the data delivery means and alter the modulation drive signal in dependence on the power data after a delay defined by the position data. The modulator drive logic means is operable to vary the modulation drive signal at the pixels disposed at least substantially regular spacings along the scan lines and the spacing between first and second adjacent pixels is smaller by a factor of at least four than the spacing between first and second adjacent scan lines. The value of the power control signal corresponds to exposure of the structure to be produced, as specified in input data.

With the parallel scan lines forming scan stripes along the substrate, such that the scan lines extend transversely across the respective scan stripe, the invention further includes methods and apparatus to suppress the visibility of the end boundaries of the stripes, particularly those end boundaries between adjacent stripes that may otherwise be caused by the apparatus that is used for writing a structure on a photosensitive surface of a substrate. In accordance with the invention, the stripes are made to overlap each other and the transition from one stripe to the next is synchronized to the position of feature edges in the data. In a preferred embodiment, the stripes are blended in the overlap according to a predetermined stepwise changing function, and the steps in the function are synchronized to the edges of the features in the pattern. By this method the benefits of the invention can be maintained across the stripe boundaries, which are rendered virtually invisible for all valid input data. This is done with a very small expenditure of increased complexity, data volume, and data pre-processing.

It is to be understood that both the foregoing general description and the following detailed description are exemplary and provided for purposes of explanation only, and are not restrictive of the invention, as claimed. Further objects, features and advantages of the present invention will be apparent from the following description.

BRIEF DESCRIPTION OF THE DRAWING

The accompanying drawings, which are incorporated in and constitute a part of the specification, illustrate the preferred embodiment of the invention, and together with the description, serve to explain the principles of the invention.

DETAILED DESCRIPTION OF PREFERRED EMBODIMENTS

Figure 1A:
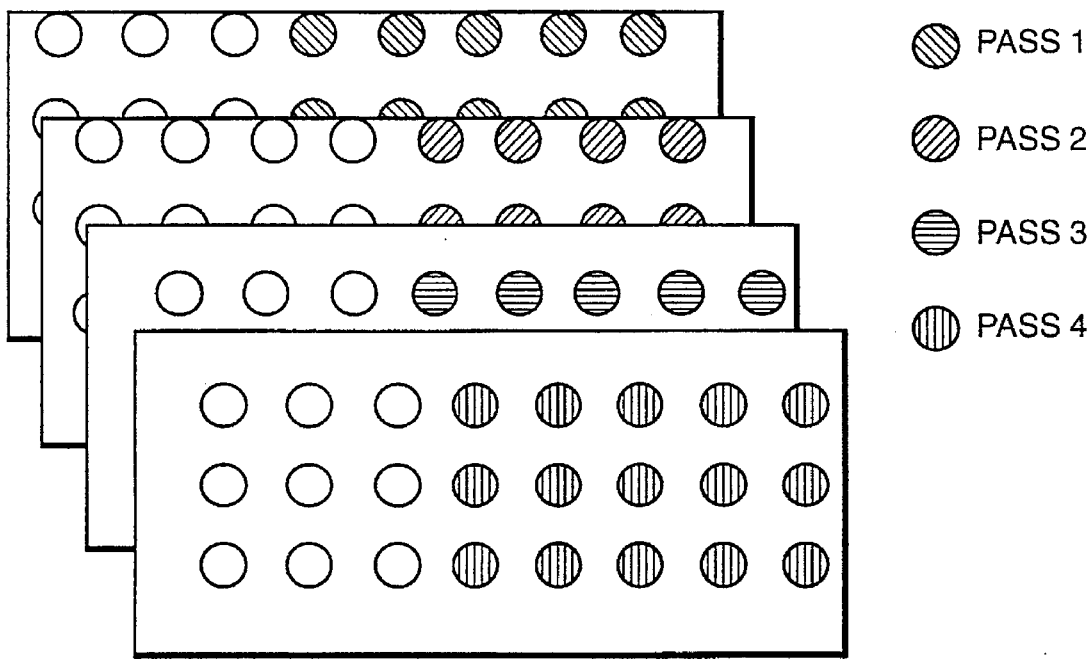
FIGS. 1a through 1d show various prior-art methods.
Figure 1B:
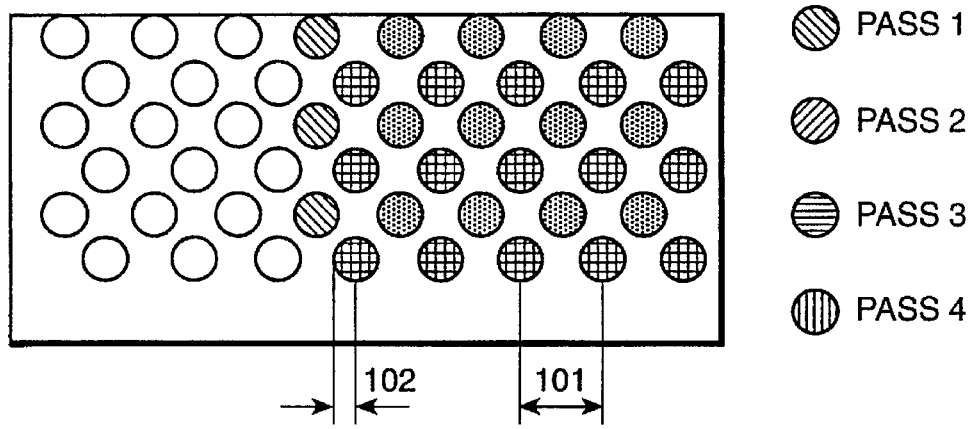

Before describing the invention in detail, attention will be briefly directed to FIGS. 1a and 1b showing prior art procedures as already described above, involving multiple scanning of a surface to produce a finer address grid, wherein successively written grids can be overlaid with a small displacement to increase the density of the grid produced. Thus, writing a 0.5 micron grid four times, as indicated at 101 in FIG. 1b, twice at the original position and twice displaced by 0.25 micron, gives an effective address grid of 0.125 micron, as indicated at 102 in FIG. 1b.

Figure 1C:
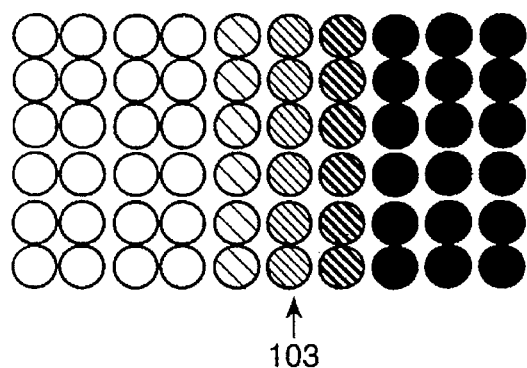
Figure 1D:
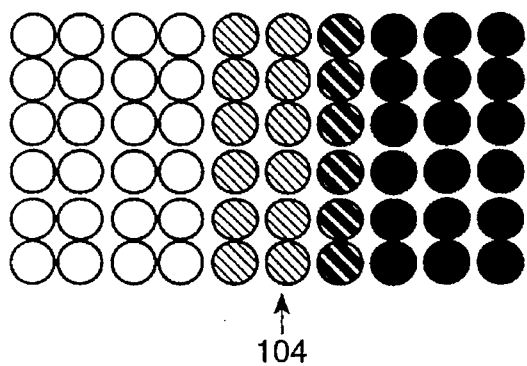

Attention will also be directed to FIGS. 1c and 1d using the above-discussed procedure based on what is known as antialiasing. Reference numerals 103 and 104 in FIGS. 1c and 1d respectively indicate the apparent positions of edges which, as indicated above, can be changed in small fractional pixel increments by the operating procedure referred to.

Figure 2A:
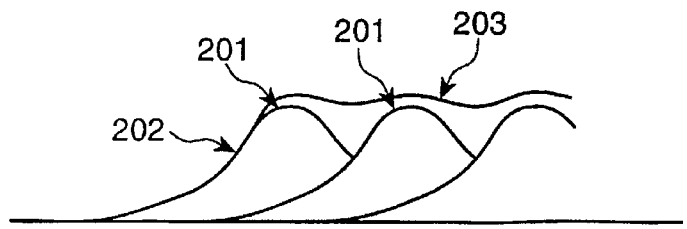
FIGS. 2a and 2b show edge regions of scan lines.
Figure 2B:
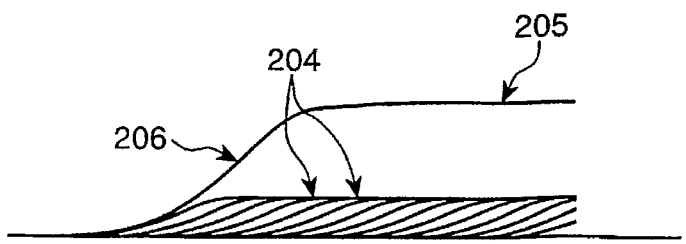

Reference will now be made to FIGS. 2a and 2b relating to the question of asymmetry between edges in two directions of a grid scan structure. FIG. 2a shows that, in a cross-section normal to the scan line, all the energy is centered on the scan lines 201 with a spread around each scan line 201. The steepness of the edge 202 of a resulting exposure 203 is determined solely by the configuration of the spread function. By suitably selecting the scan line spacing in dependence on the line spread width, it is possible to provide a filled pattern or structure with an almost even exposure. The requirement for flat smooth filling between the scan lines determines the size of the beam spot. Once the size of the spot has been established, there is no further deterioration in the degree of edge sharpness.

As shown in FIG. 2b, two effects make the edge less sharp in a direction along the scan lines. The first effect is due to the fact that the modulator is not an ideal switch but has a finite rise time which gives rise to a certain lack of sharpness in the structure. The second effect is more fundamental. The radiation energy is not outputted in a flash-like fashion at the pixel points but is switched on and off at the pixel points. FIG. 2b shows a series of closely spaced flashes, each with its spread function 204, equivalent to a scanning beam with the power continuously on. That gives rise to a smoothly rising integrated exposure as indicated at 205. In a typical scan pattern the edges 206 are 30% less steep in the direction along the scan lines 206 than transversely to the scan line.

Edge sharpness is an important parameter in terms of quality and it should be as high as possible. However the question of symmetry in terms of edge sharpness in the X- and Y-directions is equally important. The photosensitive covering and the procedure of chromium etching on a photomask involve a threshold property which means that the chromium film remains intact at the location at which the dosage of exposure is below the threshold, while it is removed at the location at which the exposure dosage is above the threshold. Different degrees of edge steepness in the various directions cause further complications in the dependency in terms of method and exposure of the dimensions in the processed patterns and require increased calibration operations and a higher degree of accuracy in terms of process control.

The X-Y-asymmetry could possibly be compensated by using an elliptical focal spot. However detailed investigation shows that in a given system the number of resolved points along the scan line is a system parameter and an elliptical focal spot which is reduced in length along the scan line results in a reduction in the length of the scan line itself and thus gives rise to a reduced writing speed.

In the present invention, a more refined address grid is achieved, which provides for optimum adaptation to the practical and theoretical limitations referred to above, so as to provide a denser pixel grid with a lower degree of expenditure in terms of writing time, volume of data and edge definition.

More particularly the invention uses a circular focal spot which ensures that the edge definition is higher than will be required in a direction transversely to the scan lines. In that direction, antialiasing interpolation is introduced between the scan lines, which ensures sub-scan line addressing. The loss of edge definition which occurs is taken from the excessive edge sharpness and restores approximate symmetry as between the X- and Y-directions.

In the direction along the scan lines, the increased address point density is ensured in such a way that edge sharpness does not suffer any deterioration. That results in an increased pixel density. The resulting, highly asymmetrical grid with a level of pixel density which is at least four times higher in a direction along the scan lines, together with one-dimensional interpolation transversely to the scan lines, permits a finer address grid in both directions, in comparison with conventional procedures, while the edge definition in the worst direction is scarcely affected.

The requirement for a higher modulation frequency does not occur as the smallest size of structure which is to be written does not shrink with the address grid. On that assumption the data always contain stretches of a plurality of address points of constant energy, and a suitable compressed data format, that is to say run length encoding, prevents an increase in the data volume in proportion to the density of the address points.

Figure 4A:
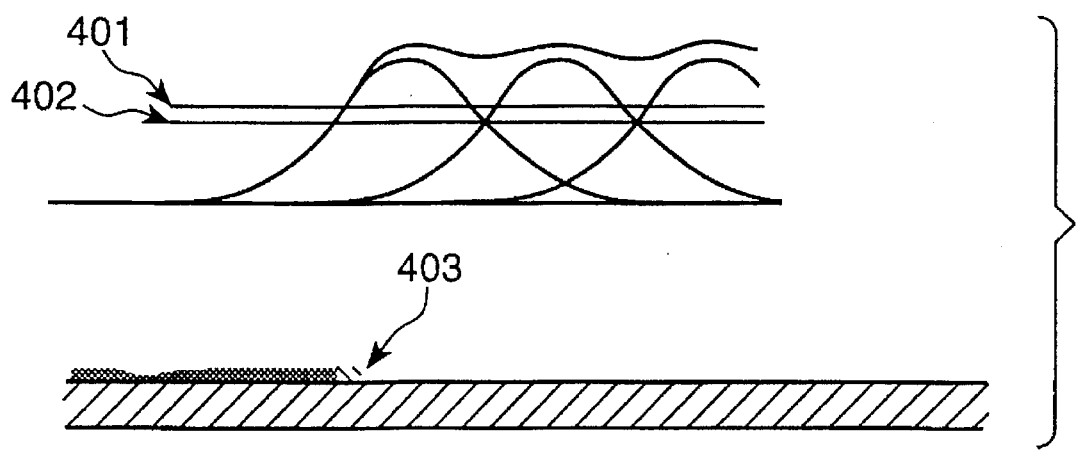
FIGS. 4a and 4b are views of edge regions of scan lines.
Figure 4B:
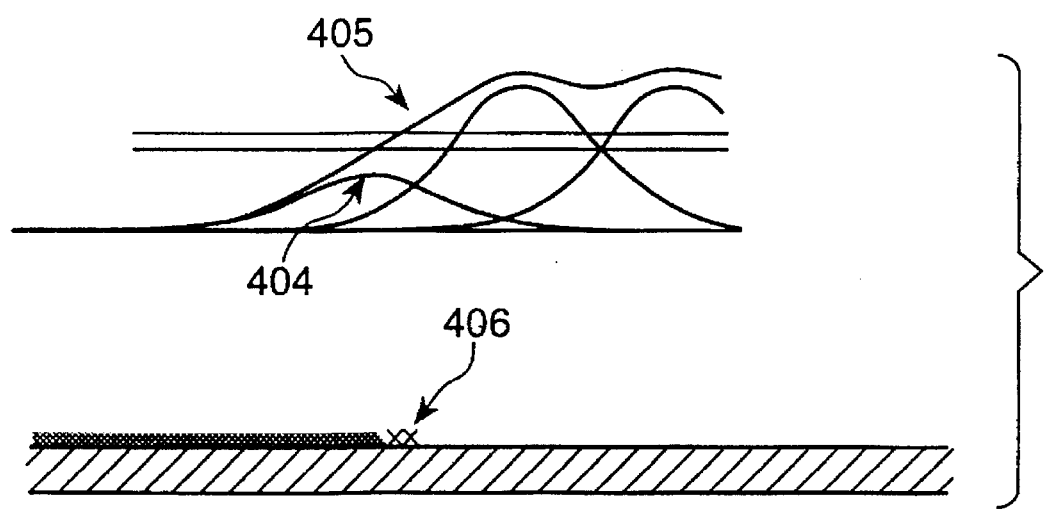

Attention will be directed at this point to FIGS. 4a and 4b showing views in cross-section normal to the longitudinal extent of the scan lines, through an edge region. FIG. 4a shows a view in cross section through an edge region without interpolation while FIG. 4b shows a similar view through the edge region with interpolation. Modern photosensitive coatings or photoresists have an extremely hard gradation, having a dosage threshold above which the photosensitive film is removed in the developer solution and below which the photosensitive film remains unaffected. FIGS. 4a and 4b each show two lines, an upper line 401 and lower line 402. The upper line 401 represents the lower limit line for complete removal of the photosensitive film during the development treatment while the lower line 402 represents the upper limit line for the highest light dosage at which the photosensitive film is not affected. For light dosages between the two lines, the result is uncertain and depends on differences in the strength and aggressiveness of the developer solution, as well as the thickness and sensitivity of the photosensitive film. That uncertainty zone constitutes a zone 403 of edge roughness and variation in feature dimensions. It will be appreciated that the exposure profile should be as steep as possible.

FIG. 4b shows a first scan line 404 with a low level of dosage, the edge 405 being displaced in comparison with the edge in FIG. 4a. In addition the edge is less steep and the zone 406 of edge roughness is somewhat wider. For the sake of clarity, the degree of roughness is shown in an exaggerated fashion, in actual fact the difference in steepness in the edge region between FIGS. 4a and 4b approximately corresponding to the difference in steepness between FIG. 2a and FIG. 2b.

Normally, interpolation at the edges of the elements of the structure is not contained in the input data, but it can be added during the data preparation operation, although the opposite is also possible.

Data delivery will now be described. The changes in the equivalent pixel data stream are slight, as is known from the assumption that a minimum size of structure is significantly greater than a pixel in the scan direction. That gives rise to two consequences, firstly that run length encoding (RLE) is effective as the storage format and secondly, that the hardware does not have to be such that it produces just any bit stream. Preferably the invention uses hardware, such that of FIG. 3, which directly processes run length-encoded data, that is to say a part of the energy value and a duration or switch position value.

In accordance with the invention, the apparatus includes data delivery means for controlling the input of said modulator while the laser beam is scanning. Generally, the data delivery means of the invention includes a clock having a predetermined clock period between clock pulses, so as to establish a regular train of clock pulses. A data processing unit is also provided for accepting input data and computing or establishing beam intensity data and beam position data for an edge in the pattern. Both the beam intensity data and the beam position data are established in a digital format. The apparatus also includes as part of the data delivery means a signal processing unit for converting the beam position data to an equivalent time for positioning the laser beam along the scan line during scanning. Particularly, this equivalent time is converted as an integer number of clock pulses plus a fractional remainder. To create a time pulse corresponding to the equivalent time, digital counting means may be provided for generating a timing pulse at a time corresponding to the integer number of clock pulses and a time delay circuit may be provided for incurring to the timing pulse a time delay equal to the fractional remainder. Once the corresponding time pulse is created, a circuit may be used for setting the modulator input signal to the digital beam intensity data at the arrival of the timing pulse.

Figure 3:
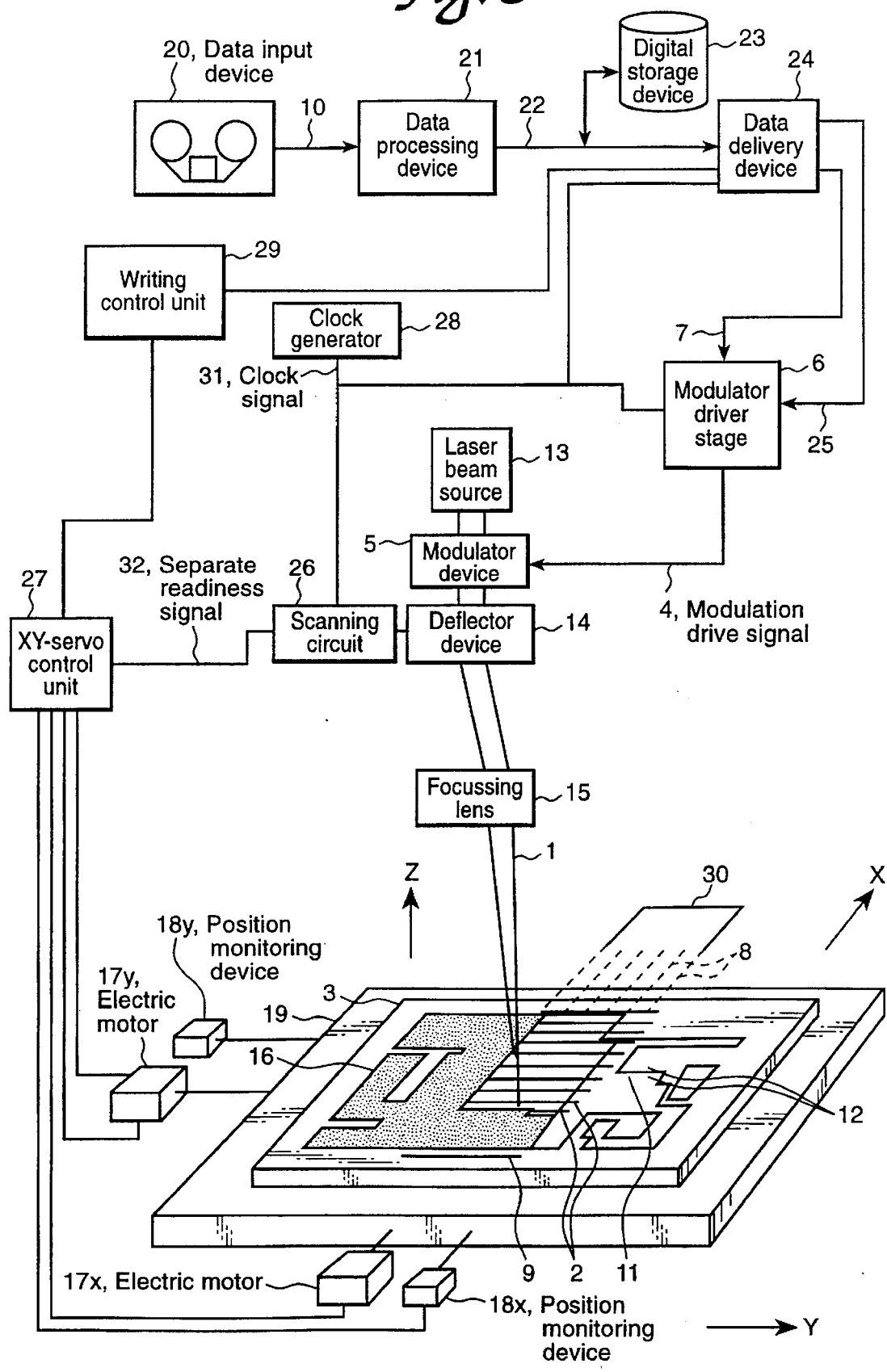
FIG. 3 shows an apparatus for producing a surface pattern or structure constituting an embodiment of the present invention.

With reference now to the preferred embodiment of the invention shown in FIG. 3, the repeated loading of RLE data items into a modulator driver logic means 6 occurs at a rate which is normally lower than the pixel rate. Data loading occurs at the rate of a data delivery clock which has a clock speed which is compatible with standard IC families, for example FAST-TTL. Two data items can be combined to provide a data word for effective use of the available bits. The modulator driver logic means 6 separates the power and change position fields at the input and supplies a modulation means 5 with the power control signal after a time which is derived from one or both of the last position fields. If the data delivery clock is of a frequency which is lower than the pixel rate, which is normally the case, the delay in the modulator control signal is not generated by a counter but preferably by selection from the various clock signals with time delays between them.

The step of loading an RLE item for each clock cycle or for each clock phase in the case of multi-phase clocks of the data delivery clock prevents the writing of structure elements which are shorter than the equivalent of a clock cycle or a clock phase.

The beam power may be modulated either by modulation of the light source or by using a modulator with a continuous light source. It is also possible to provide for a non-linear relationship between the exposure of the outermost pixel at the edge of an element of the structure and displacement of that edge, by using a table lookup or reading procedure or other correction processes. It is also possible to modify the exposure of more than one row of pixels along the edge in order to produce an exposure gradient which is independent of the position in relation to the scan lines.

In contrast to the multi-pass principle used in above-mentioned British patent specification No. 2,215,553, the present invention provides for variable exposure by modulation of the beam to different power levels during a single writing pass. The result is a grid of any degree of fineness, without any throughput difficulties.

It is possible for the invention to be used in such a way that successive pixels, with unchanged power, can be written without more than one control word being generated.

Reference will now be made to FIG. 3 showing a preferred embodiment of an apparatus for producing surface patterns or structures on photosensitively coated supports or substrates. In the illustrated embodiment, the substrate as indicated at 3 is in the form of a glass plate which is covered with a photosensitive coating, for example a photoresist. The glass plate 3 is disposed on an object table 19 which is movable in the X- and Y-directions. A writing head with a focussing lens 15 and a deflector device 14 which is preferably in the form of an acousto-optical deflector device is arranged to be stationary in the X- and Y-directions. However the focussing lens 15 is freely movable in the vertical direction (the Z-direction). It is disposed a few microns above the surface of the glass plate 3 on an air cushion. As the air cushion is loaded only with the weight of the focussing lens 15, the height of the air cushion can be kept constant, by virtue of the independence of the Z-co-ordinate, so that the surface of the glass plate always remains in the focal plane, even if the surface is uneven.

A laser beam source 13 produces a laser beam which is modulated in regard to its power and in particular its intensity by a modulator device 5, more especially an acousto-optical modulator device. The focussing lens 15 focusses on the laser beam and forms a focussed laser beam as indicated at 1, which is directed on to the surface of the glass plate substrate 3.

For monitoring the positioning of the object table 19, the apparatus has position monitoring devices 18x and 18y which monitor the positioning of the object table 19 in the X- and Y-directions relative to the writing head (deflector device 14 and focussing lens 15). Together with electric motors 17x and 17y, the position monitoring devices 18x and 18y form a servo mechanism which produces the precisely controlled movement of the object table 19.

The servo mechanism which is operative in the X-direction moves the object table 19 by means of the electric motor 17x which is preferably in the form of a linear motor, in the X-direction at a constant speed for producing stripes 30 of a given width when the laser beam 4 scans along the scan lines 2. When a respective stripe 30 is completed, the X-servo mechanism performs a retrace stroke movement into the starting position and the object table 19 is then moved in the Y-direction by the width of a stripe by the electric motor 17y which is also preferably in the form of a stepping motor.

A scanning circuit 26 generates a high frequency deflection signal with linear ramp function. The scanning circuit 26 is connected to the deflector device 14. That arrangement produces linear deflection of the laser beam 1 in the width of the respective stripe 30. The focal spot of the focussed laser beam 1 is deflected on the surface of the glass plate 3 along the scan lines 2 which extend normal to the longitudinal extent of the stripes 30. Reference numeral 8 in FIG. 3 identifies the positions of the pixels in the scan lines 2 in a purely diagrammatic fashion, that is to say, not to scale.

The laser beam source 13 which is for example an HeCd laser generates the laser beam 1 at a preferred wavelength of 442 nm. The laser beam is passed through the acousto-optical modulator 5 which is actuated by a high-frequency modulation drive signal 4. The modulation drive signal 4 is supplied by the modulator driver logic means 6. The intensity or power of the modulation drive signal 4 is controlled by an analog modulation drive signal of a digital-analog converter. The digital-analog converter which is disposed in the modulator driver stage or logic means 6, as shown in FIG. 6, is controlled by a power control signal 7 by way of a storage device which is preferably in the form of a register, for storage of the digital power control word required for producing the control effect.

Figure 6:
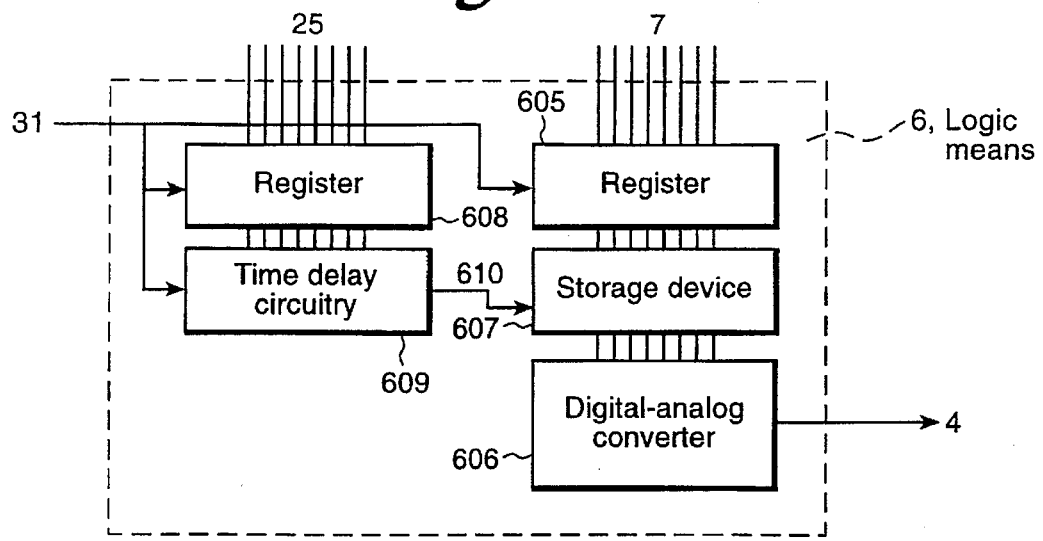
FIG. 6 shows an embodiment of a modulator driver logic that can be used in the apparatus of FIG. 3.

Reference will be made at this point to FIG. 6 showing a preferred embodiment of the modulator drive logic means 6 described above with reference to FIG. 3. It has two storage devices for bit words, in the form of registers 605 and 608. The register 605 is loaded with intensity or power data 7 coming from the data delivery device 24 shown in FIG. 3. The register 608 is loaded with position or delay data 25 which also come from the data delivery device 24. That takes place on the basis of a transition caused by the clock signal 31. In that arrangement, a digital-analog converter 606 is also operated by power data previously stored in the storage device 607. It may also be in the form of a register. A digitally controlled delay circuit 609 transfers the clock signal 31 to its output side, with a delay which depends on the data stored in the register 608. After that delay the active edge of the clock signal is supplied at the output 610 of the delay circuit 609. The value stored in the register 605 is loaded into the register 607 and passed to the input side of the digital-analog converter 606. After an internal delay in the digital-analog converter 606, a fresh analog power control signal 7 occurs at the output of the modulator driver stage of the modulator device 5.

Going back now to FIG. 3 in which it will be noted that the thick arrowed lines represent the flow of data relating to the structure and the thin lines represent the lines for the control signals, the FIG. 3 embodiment further includes the writing control unit 29 which can be in the form of a processor. The control unit 29 initiates the operation of reading of the data from a storage device 23 and sends instruction or command signals to an XY-servo control unit 27 for controlling the movement of the object table 19. A clock generator 28 generates the clock signal 31 which synchronizes operation of the data delivery logic means or device 24, the modulator driver logic means 6 and the deflector circuit 26. The servo control device 27 further supplies a separate readiness signal 32 to the deflector circuit 26. That readiness signal 32 ensures that operation of the deflector device 14 does not occur until the object table 19 reaches its correct X-position. That provides for accurate positioning of the object table 19, in regard to the deflector device 14. As the modulator device 5 and the deflector device 14 operate in an inertia-free fashion and are driven by the same clock signal 31, that arrangement provides a high degree of positional accuracy.

The XY-servo control unit 27 thus co-operates in timed relationship with the servo system 17x, 17y, 18x, 18y and the deflector circuit 26, so as to ensure that the scan line stripes 30, scanning in the respective stripe width by the deflector device 14 and modulation by the modulator device 5 are performed synchronously. That ensures that the average positional error is less than 0.05 micron including environmental influences on the laser interferometers constituting the position monitoring devices 18x and 18y. In the illustrated embodiment the position word comprises eleven bits and the power word comprises four bits. It is possible to produce a 0.5×0.03125 micron address grid with time delay only and 0.03125×0.03125 micron address grid with both time delay and intensity modulation. That results in approximation errors which are compatible with the requirements described hereinbefore. The clock frequency is preferably 25 MHz and the scanning length which corresponds to the width of the stripes 30 is preferably 160 microns. Including time lost to scanning and strip retraces, the writing speed is four square millimeters per second with a single writing beam.

The invention may also use a plurality of writing beams instead of the single writing beam. Such a procedure then requires a suitable number of modulators, lens, parallel data paths and so forth.

The position field contains sufficient data to compute an absolute position for a change in power, but the position field is not necessarily encoded as an absolute position. Particularly when using paired power and run length data, run length encoding can be effected either as a spacing in order to retain the current value before the next change, or as a spacing in order to retain the next current value, or as an absolute position at which the next value begins, or as an absolute position at which the next value ends, or as any other adequate encoding. In addition the position field may contain two sub-fields with one sub-field being absolute and another being relative. Instead of the modulator device 5, it is also possible to use a modulated light source, for example a semiconductor laser or a plurality of semiconductor lasers.

Still continuing now with the description of the apparatus shown in FIG. 3, a data input device 20 includes input data for the structure as indicated at 9, which is to be produced on the substrate 3. Such data occur in the form of a list of structure or pattern elements 12 and 16 or regular structure formulae or constants so that the structure elements can be computed. The specification of exposure can be standardized to a maximum exposure or implicitly assumed in the case of a single exposure value for all patterns. In all cases X- and Y-length scales, the angle between the axes and the absolute exposure dosage can be modified by the operator, from what is specified in the input data. It is also possible to carry out other data processing operations, for example mirroring, inversion, gray-scale corrections and pre-compensation operations for underetching or proximity effects. The delivery clock may be a single-phase or multi-phase clock and loading of the run length encoding data items may be effected in one register or in two or more registers. The decoding logic may involve a pre-recall operation or other buffers in order to increase operating speed.

For the purpose of increasing operating speed it is also possible to multiply a part of the data paths, for example to provide a plurality of modulator driver logic means, even if only one laser beam is used.

The relative movement as between the writing head and the substrate can be produced by the writing head moving relative to the stationary substrate or vice-versa. It is also possible for the writing head to be moved in one direction and for the substrate to be moved in a direction perpendicular thereto.

Figure 5A:
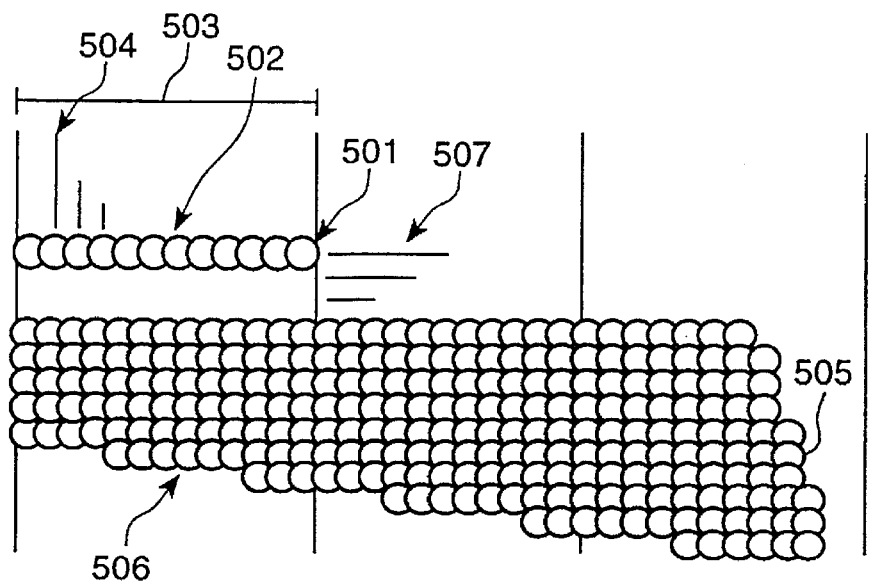
FIG. 5a is a fixed pixel grid.

For purpose of further explanation, reference is made to FIG. 5a, which shows a fixed grid with small circles showing the diffraction-limited extent of each pixel. The pixels are centered on a pixel grid 504 and a scan line stripe 503 is formed by successive scan lines indicated at 502. The pixels are centered on the scan line 502 and are arranged at equal spacings from each other. The pixel spacing and the spacing of successive scan lines 506 are the same. FIG. 5a shows an exposed scan line 502 and a region which is filled with pixels and which extends over three stripes 503. That region has an edge 505 which extends inclinedly relative to the vertical and an edge 506 which extends inclinedly relative to the horizontal. With the illustrated structure it is not possible for the edge to be positioned at fractional pixel points so that the inclined edge configuration is of a jagged or ragged configuration.

Figure 5B:
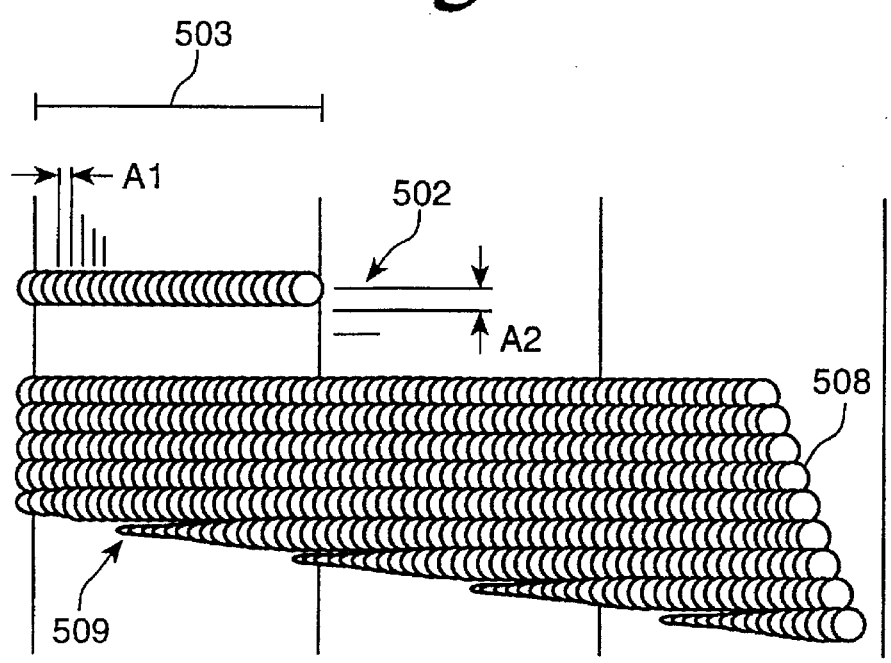
FIG. 5b shows a pixel arrangement constituting an embodiment of the invention.

In contrast, FIG. 5b shows a pixel arrangement according to the invention in which the pixel density along the scan lines 502 is higher, more specifically by a factor of at least four, than in the direction of the longitudinal extent of the stripes 503 or normal to the scan line 502. That is also indicated in FIG. 5b by the spacings A1 and A2. A1 identifies the spacing of the respective pixel addressing in a scan line 502 while A2 identifies the spacing of the respective scan lines 502 from each other. As can be seen from FIG. 5b, that provides for extremely fine addressing at the vertical edge. It is therefore possible to have a relatively smooth configuration, even in the case of an edge as indicated at 508 which extends inclinedly relative to the vertical.

The power modulation effect which is advantageously also used in a preferred embodiment of the invention also improves an edge 509 which extends inclinedly relatively to the horizontal, as can be clearly seen from FIG. 5b. It will thus be seen that it is possible to achieve extremely fine addressing with the invention, and also a smooth edge configuration, even in relation to inclined edges. Those advantages are achieved although the writing time is not different in relation to the embodiment shown in FIG. 5a and the embodiment of the invention shown in FIG. 5b. The present invention can provide for an increase in the level of versatility when writing different surface patterns or structures, and additional freedom in relation to the discrete grid which is predetermined by the scan lines and the pixel clock.

In operation, and with reference to FIG. 3, the geometrical properties of the structure 9 to be produced or the structure elements 12, 16, together with their exposure, are specified in the data input means 20 in a format which is transmitted to a data processing device 21. The data processing device 21 provides for conversion of the geometrical data into an intermediate compressed format 22. The compressed format 22 is inputted into a digital storage device 23. The compressed format is also passed to a data delivery device 24 in which the stored data are processed to provide an internal data format comprising a pair of data contents 7 and 25, namely a data content 7 in relation to beam power and a data content 25 in relation to position. The data content 25 may include delay data, as has already been described above with referenced to FIG. 6. The data content 7 in relation to beam power is passed in the form of a power control signal 7 to the modulator driver stage 6 while the data content 25 in relation to position is passed in the form of a position signal 25 to the modulator driver stage 6. The modulator driver stage 6 which is in the form of a logic circuit calls up those data from the data delivery device 24. The modulator driver stage 6 supplies the modulation drive signal 4 which is variable at the pixel points 8 arranged at regular spacings along the scan lines 2 extending normal to the stripes 30. The spacing between two adjacent pixel points 8 along the scan lines 2 is smaller by a factor of at least four than the spacing between two adjacent scan lines.

By means of the principles of the present invention, it is possible to produce a fine structure 9 which is composed from the elements 12 and 16 by means of the focussed laser beam 1, the degree of accuracy of which is comparable to those structures which are produced by means of electron beam machines. Advantageously, the apparatus according to the invention requires a considerably lower level of expenditure than is involved in electron beam machines. The invention further provides a considerable improvement in the address grid by virtue of the fact that in the longitudinal direction of the scan lines the spacing between adjacent pixel points is smaller than the spacing between adjacent scan lines. This results in an improvement in the degree of addressing or grid resolution with a lower level of edge deterioration than when using an antialiasing system, particularly when power modulation is used as described above, while retaining a manageable volume of data.

Writing of arbitrary patterns may be performed accurately and efficiently using the method and apparatus of the invention. Preferably, however, it is desirable that the following two conditions are met. First, the modulator drive signal should only change value once per data clock period. Second, the time between two successive changes in the modulator drive signal should not be smaller than a specific value, referred to hereinafter as the minimum feature size. In accordance with the first condition, features longer than one clock period can always be written regardless their position relative to the grid. The minimum feature size of the second condition, therefore, is generally considered to be one clock period.

In practice, it is possible that a portion of a pattern will be smaller than the minimum feature size when the pattern is cut or divided into scan stripes. For example, and with reference to FIG. 7 for purpose of explanation, two sets of parallel scan lines 701, 702 form two adjacent scan stripes and share a stripe boundary 703. Positions along the scan line corresponding to the clock pulses are shown as lines 704, and the minimum feature size is equal to one clock cycle 705. Although a long feature 706 can be divided without problems at the stripe boundary 703, features that protrude only slightly into an adjacent stripe will produce small pattern elements 707 that may violate the minimum feature size condition when divided.

Figure 7:
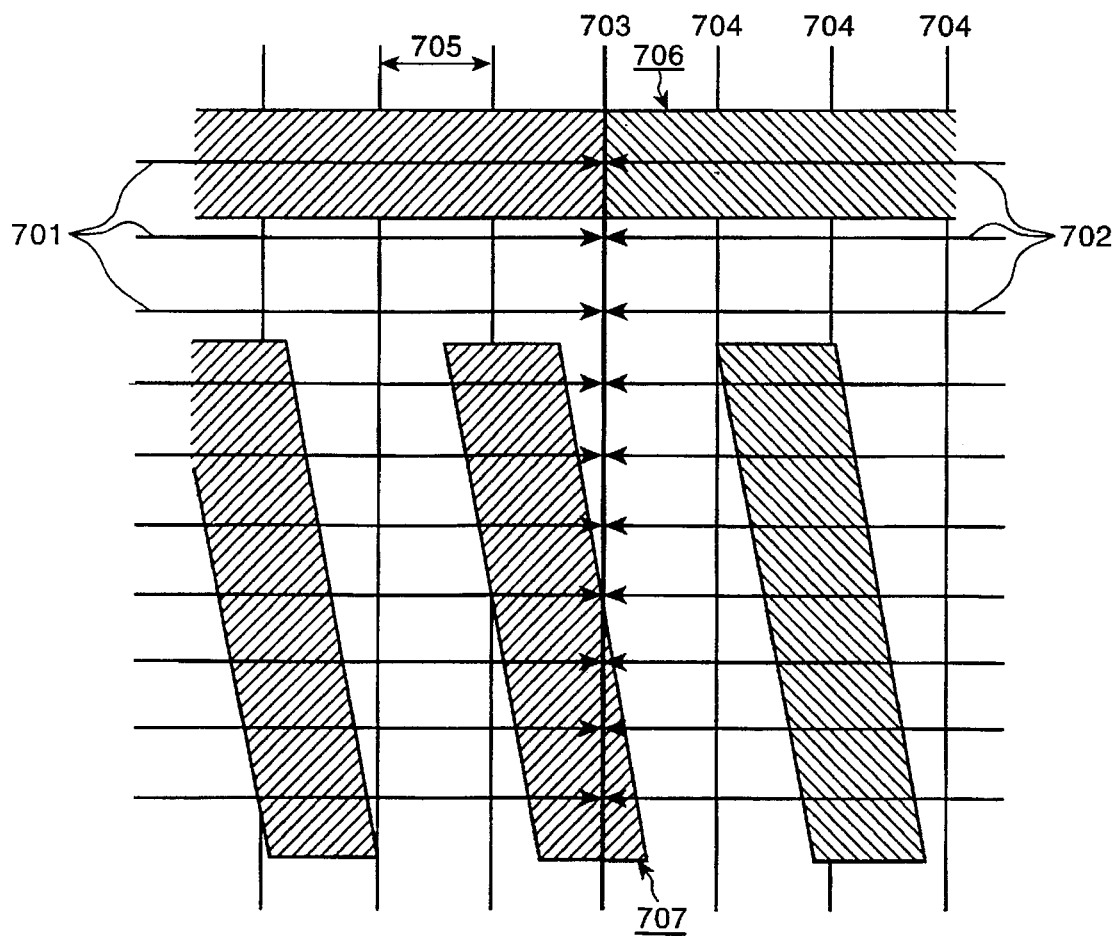
FIG. 7 is an illustrative representation of a pattern having an area extending slightly across the stripe boundary that is smaller than the minimum feature size desired.

One method used by the assignee of this application to avoid violation of the second condition is to generate features that satisfy the minimum feature requirement and extend outside the scan stripe. An independent gating or window signal is then used to cut the features at the stripe boundary. In this manner, very short pulses can be generated when necessary. However, the low-pass characteristics and non-linearity of the modulator distorts the short pulses, and a pattern like that in FIG. 7 is still difficult to write without visible artifacts.

Figure 8:
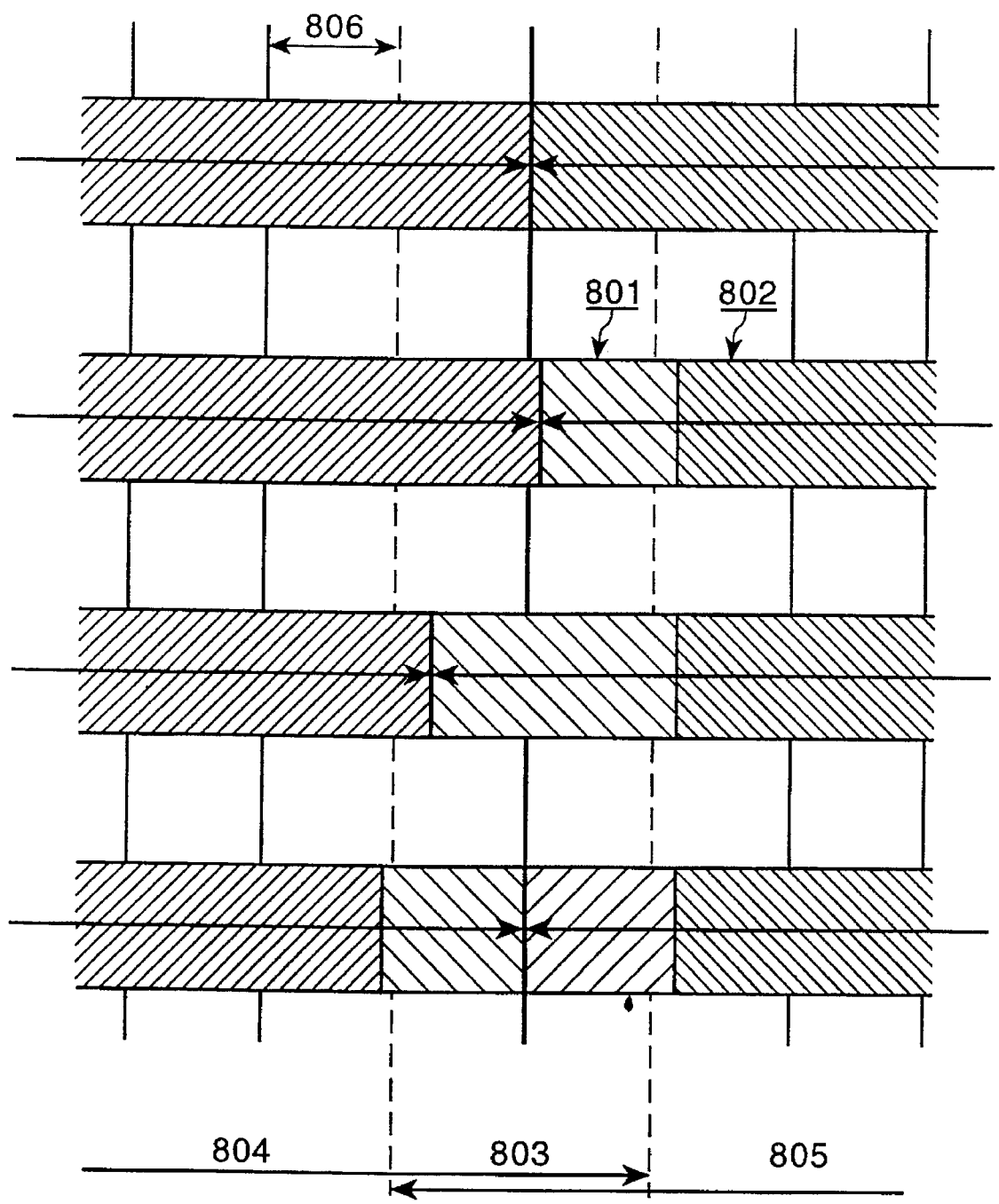
FIG. 8 is an illustrative representation of an additional aspect of the invention, wherein the stripe boundary between adjacent stripes is moved for each scan line to eliminate pattern areas that would otherwise be smaller than the desired minimum size.

In accordance with an additional aspect of the invention, therefore, the method and apparatus embodied herein prevents any pattern elements smaller than the minimum feature size from being written. Particularly, the method and apparatus of the invention changes the position of the stripe boundary from scan line to scan line depending on the written pattern. FIG. 8 shows the placement of the boundary for a number of cases, wherein the transition between exposed and unexposed elements 801, 802 is performed using different power levels rather than a modulator on-off process. In each case, the boundary is placed so that the exposed and unexposed elements are at least as large as the minimum feature size, so as not to violate the second condition defined above. FIG. 8 further shows that there also may be an overlap 803 of the scan lines 804 and 805 of at least twice the minimum feature size 806. Within this overlap 803, there is either a transition in the modulator drive signal, or the pattern feature is long enough to be cut in two parts satisfying the minimum feature size condition.

One important performance criterion in a scanning pattern generator is the ability to print small pattern elements across the boundary between adjacent scan stripes without error. Typically, each stripe is slightly displaced relative the adjacent ones, since they are not written at exactly the same time and any system has some drift and position noise. A mismatch between the patterns on two sides of a stripe boundary is referred to here as butting error. Therefore, if a small pattern element is located across a stripe boundary, a size error of the pattern element will typically occur due to the butting error.

An example of such a size error is provided for purpose of explanation and not limitation. In a 5X photomask for a 0.5 µm VLSI device, the transistor gates are 2.5 µm long. The need for absolute position accuracy in the mask may be 100 nm (three sigma value). But if the stripes are randomly displaced by ±100 nm, somewhere in the mask there can be a relative displacement between two adjacent stripes of perhaps 170 nm. If transistor gates are placed across this stripe boundary, they are dilated by 170 nm, or 7% of 2.5 µm. This size error affects the characteristics of the transistors and can cause malfunction of the entire circuit, or lower the tolerance to other process errors, thus lowering the process yield.

One known method to reduce butting errors is to write several passes with the stripes displaced between the passes. Butting errors are averaged out, but the method is wasteful because essentially the same pattern has to be written several times.

In accordance with an additional aspect of the invention, therefore, a method and apparatus is provided to reduce the influence of butting errors with a minimal loss of throughput. In the invention, a moderate overlap between successive scan stripes is introduced and the stripes are blended in the overlap region. The transition from one stripe to the next is not abrupt, and the butting errors are effectively distributed over the overlap region, typically between about 5 to 10% of the stripe width. Therefore, and with reference to the drawings of the example set forth above, the butting error can be spread out over an overlap of 10 µm. In this manner, a feature that is 2.5 µm will see only one fourth of the total butting error, i.e., 42 nm or less than 2% size error.

Figure 9:
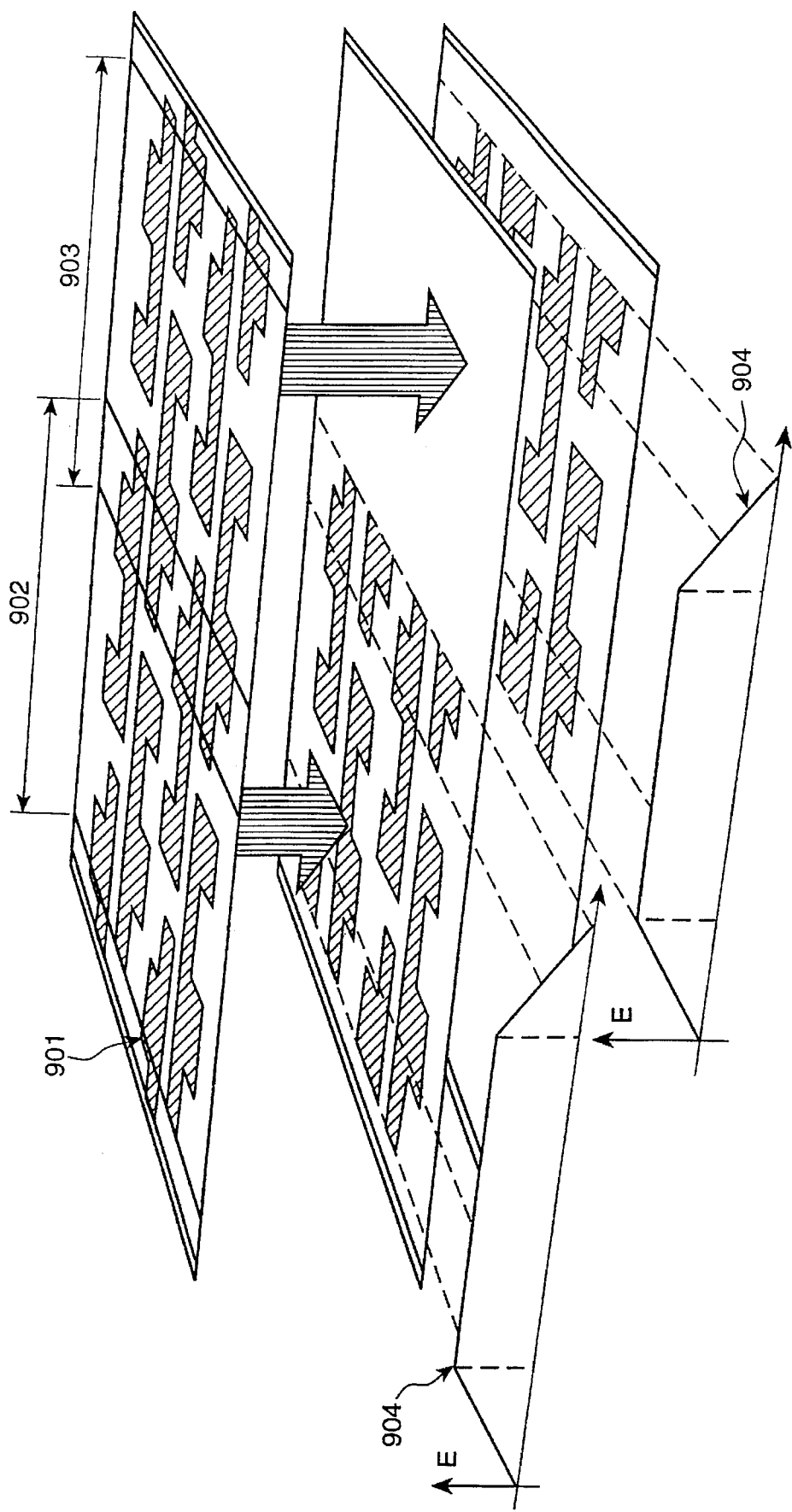
FIG. 9 is an illustrative representation of another aspect of the invention, wherein the pattern is divided into partially overlapping stripes and the exposure is blended in the overlap by an exposure blend function.

FIG. 9 is a schematic representation of the overlap and blend function of the invention. The pattern data 901 is cut or divided into data stripes 902 and 903, wherein the data stripes 902 and 903 partially overlap each other. An exposure blend function 904 determines the exposure energy along a scan line. The blend function 904 is established so that the data stripes, when blended together, produce an even exposure of the pattern. Specifically, the blend function is used to modulate the exposure level of the pattern data of each data stripe, so that the exposure is the product of the pattern data and the blend function.

To perform the blend function and thus reduce the influence of butting errors, it is possible to let the light beam pass two modulators in series, one for the data and one for the blend function. More convenient, however, is to combine the data and blend function into a single electronic signal that is fed to a single modulator. In this manner, the use of one modulator rather than two allows for better light efficiency, since each modulator has an insertion loss of approximately 20%. Additionally, an optical train having a single modulator is also considerably less complicated, less expensive, and easier to adjust than one having two modulators in series.

Figure 10:
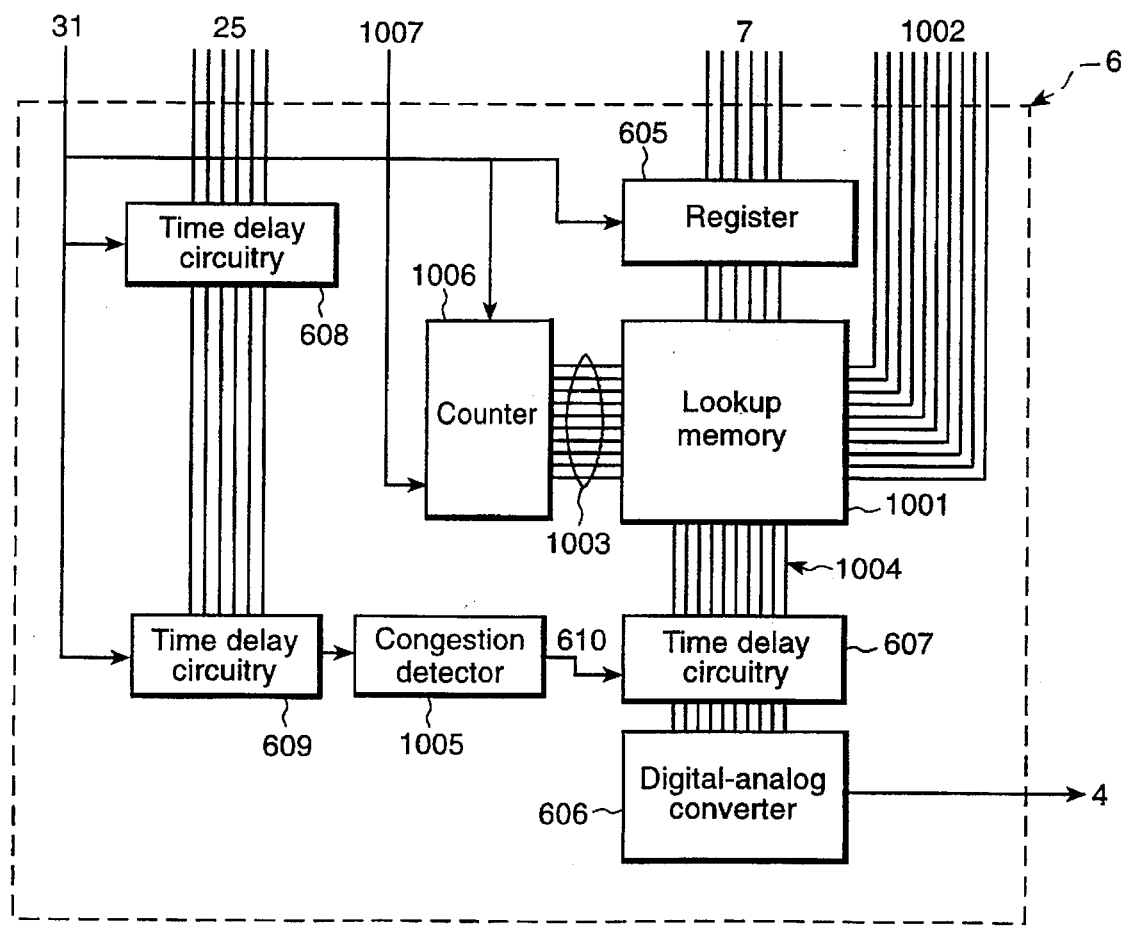
FIG. 10 shows an embodiment of a modulator driver logic of the invention that may be used for blending of overlapping stripes of FIG. 9.

The preferred embodiment of the apparatus used for performing this combined modulation is shown in FIG. 10.

This modulator drive logic 6 includes all the same elements as that of FIG. 6, as indicated by the same reference characters, as well as additional elements to perform the exposure blend function.

As noted above, modulator drive signal 4 is produced using both time delay data 25 and power data 7. The exposure blend function is stored in the lookup memory 1001, which can be loaded through the processor interface 1002. The intensity data 7 and the clock count 1003 within the scan line are used to address one cell at a time in the lookup memory 1001. In turn, the lookup memory 1001 outputs for each clock cycle an intensity value 1004 that corresponds to the product of the power blend function and power data and is corrected for the non-linearity of the modulator. Additionally, the time delay circuitry 608, 609, 607 works substantially identically to that of FIG. 6 except the latch 607 is clocked not only when the power input data 7 changes, but at every clock cycle in order to update the digital-analog converter with new values of the exposure blend function.

The cycle count comes from the counter 1006, which counts cycles on the data clock 31 and is reset at the start of every scan line by a start-of-scan pulse 1007. A congestion detector 1005 is added to assure that the minimum feature size condition is not violated, and removes one clock pulse if it is. The removed clock pulse is one that does not refer to a transition in the power data 7. This process causes a variation in the function that is difficult to predict beforehand, but is completely determined by the input data. The patterns in the stripes are identical in the overlap and the circuit works exactly the same in both stripes. The principle is to let the timing of the exposure blending synchronize to the pattern data in a deterministic way so as to have exactly the same pattern in both stripes.

Figure 11:
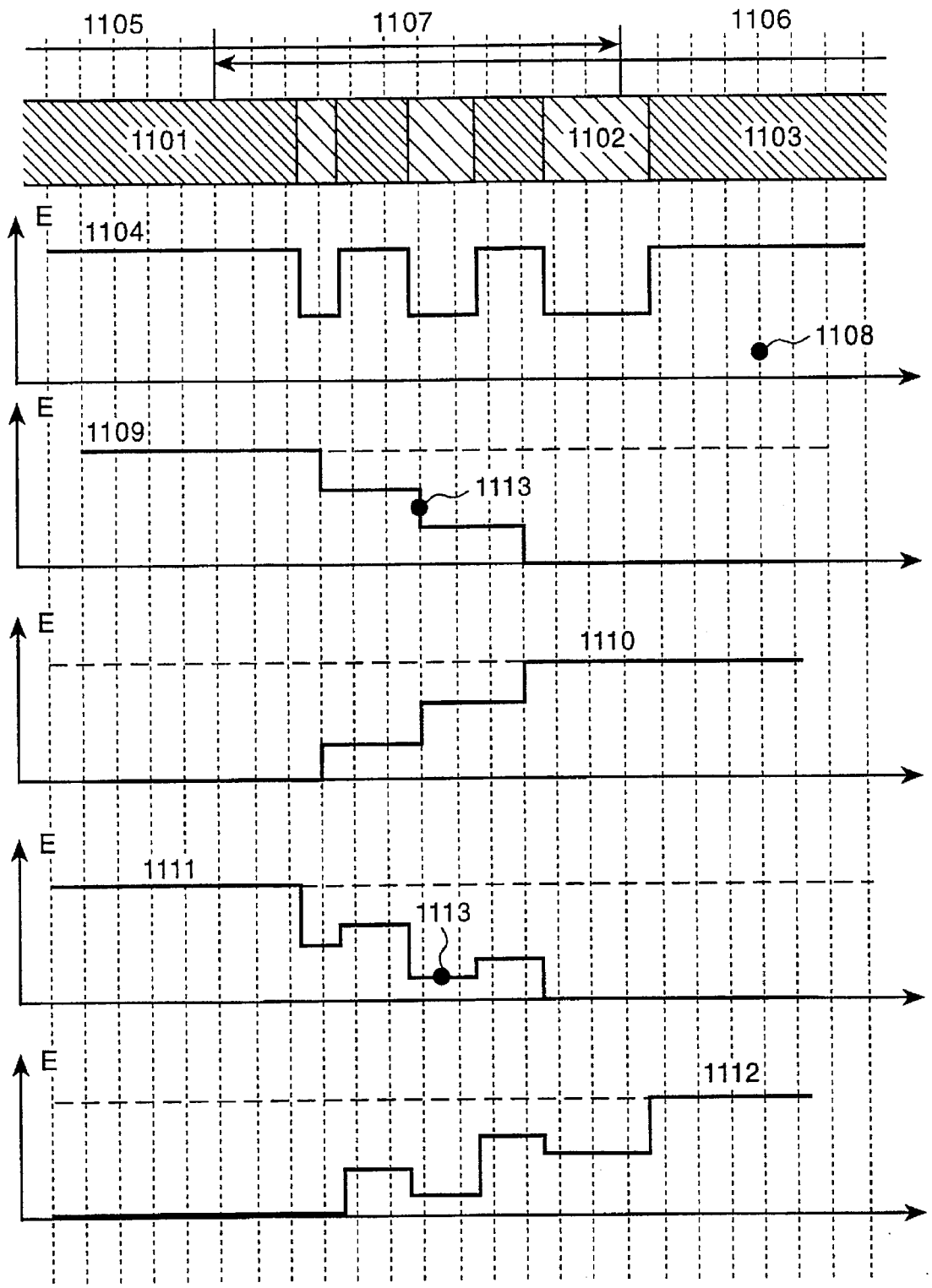
FIG. 11 is a position and time chart, which illustrates the function of the embodiment of FIG. 10.

FIG. 11 is a position and time chart, which depicts how two stripes are blended in the overlap region. The pattern to be written 1101 consists of elements with two different exposure levels 1102, 1103. The graph 1104 is the exposure E to be written corresponding to the pattern 1101. The horizontal axis therefore represents both a position axis and a time axis, since the scanning is linear from left to right. The two stripes are shown by the arrows 1105 and 1106, respectively, with the overlap identified by reference character 1107. The vertical lines 1108 in the position and time chart represent the clock pulses.

The right and left ends of the exposure blend function are shown by the graphs 1109 and 1110. Likewise, the value of the modulator drive signal for each of the two stripes is shown by the graphs 1111 and 1112, respectively. It is shown that graph 1111 is the product of 1104 and 1109, while graph 1112 is the product of 1104 and 1110. Additionally, and for purpose of example, it is shown that the steps in 1109 are synchronized within one clock cycle with the steps in the data, except for the step 1113 where the congestion detector has delayed it one more cycle, since it would violate the minimum feature condition described above if it was allowed to occur in its own clock cycle.

When combined, the sum of 1111 and 1112 is equal to 1104. The pattern 1101 corresponding to the data 1104 is therefore blended in the overlap between the stripes 1105 and 1106 by the blend functions 1109, 1110, and the blend function timing is synchronized to the data to produce the modulator drive signals 1111 and 1112. Additionally, the stripes preferably extend two clock cycles outside the region where the blend functions are both non-zero. This is to make sure that the patterns in both stripes are identical and that no end effects alter the synchronization of blend functions to data where there is exposure in both stripes.

The shape of the exposure blend function, the length of the overlap, and the number of steps from 0 to 100% are determined by the system software, and can be made parameters to be input by the user of the pattern generator. For a very critical pattern, the overlap can be increased up to half the stripe width and the number of steps can be increased, while for a less critical job the overlap can be reduced for higher through-put. The contents of the lookup memory are calibrated by measurement of the actual beam power to make the true exposure follow the theoretical blend function.

In a further embodiment of the invention, the exposure blend signal also contains information regarding exposure variations along the scan line, in addition to the information of the blending in the overlap region. By measuring the true exposure along the scan line and adding an appropriate correction to the exposure blend function, any unwanted exposure variations can be removed. The corrections are of a very small magnitude, typically about 2%, and the unpredictability of timing caused by the congestion detector is generally unimportant.

It will be appreciated that the above-described description of the present invention has been set forth solely by way of example and illustration of the principles of the present invention and that various other modifications and alterations may be made therein without thereby departing from the spirit and scope of the invention.

What is claimed is:

1. A method of producing on a substrate a surface pattern for which the position and dimension of fundamental forms thereof are to be controlled in incremental steps that are substantially smaller than the dimension of the smallest fundamental form, the method comprising the steps of:

scanning with a laser beam along parallel scan lines arranged at approximately equal spacing from each other on the substrate; and controlling intensity of said laser beam while scanning, wherein the step of controlling the laser beam intensity includes establishing a regular train of clock pulses with a predetermined clock period between the pulses, establishing beam intensity data in a digital format for an edge of the pattern, establishing beam position data in a digital format, converting the beam position data to an equivalent time for positioning the laser beam along the scan line during scanning, the equivalent time being an integer number of clock pulses plus a fractional remainder, creating a timing pulse corresponding to the equivalent time by counting the integer number of clock pulses digitally and adding a time delay for the fractional remainder, and using the timing pulse to actuate the setting of the laser beam intensity according to the beam intensity data.

2. A method as set forth in claim 1, wherein the incremental step by which the position data is changed along each scan line is smaller by at least a factor of four than the spacing between adjacent scan lines.

3. A method as set forth in claim 1, further including the step of reducing the value of the laser beam intensity to a lesser value when the distance, normal to the scan lines, between a scan line and an edge of the pattern is less than k times the spacing between adjacent scan lines, wherein k is a constant.

4. A method as set forth in claim 3, wherein said constant k is of a value of between about 0.4 and 2.1.

5. A method as set forth in claim 1, wherein the data are run length encoded.

6. A method as set forth in claim 1, wherein table lookup correction is provided and effected at the beam intensity data.

7. A method as set forth in claim 1, wherein table lookup correction is effected at the beam position data before being converted to the equivalent time.

8. A method as set forth in claim 7, wherein table lookup correction by at least one bit is effected in relation to the beam position data.

9. A method as set forth in claim 1, wherein the substrate has a coating of photoresist that is to be exposed by the laser beam so as to produce said surface pattern.

10. A method as set forth in claim 1, wherein only two different intensity levels of said laser beam intensity are used for forming the patterns.

11. A method as set forth in claim 10, wherein the two intensity levels are a zero intensity level and a constant non-zero intensity level.

12. A method as set forth in claim 1, wherein the laser beam is scanning in parallel scan lines and the stage is moving in the perpendicular direction, forming parallel stripes, and where successive stripes are written with an overlap of at least one clock pulse.

13. A method as set forth in claim 12, wherein the stripe boundary in a scan line where the writing ends in one stripe and starts in the corresponding scan line in the adjacent stripe, is synchronized to a transition by a modulator drive signal as specified in the beam data.

14. A method as set forth in claim 13, wherein the beam data in the overlapping regions of two stripes are identical and line-by-line synchronization between the stripe boundary and the transitions in the beam data is done by a synchronization circuit at the time of writing.

15. An apparatus for producing on a substrate a surface pattern for which the position and dimension of fundamental forms thereof are to be controlled in incremental steps which are substantially smaller than the dimension of the smallest fundamental form, the apparatus comprising:

a laser beam source for scanning a laser beam along parallel scan lines arranged at approximately equal spacing from each other on the substrate;

a modulator for controlling laser beam intensity; and data delivery means for controlling the input of said modulator while the laser beam is scanning, wherein the data delivery means includes a clock with a predetermined clock period between the clock pulses, a data processing unit for accepting input data and computing beam intensity data and beam position data, each in digital format, for an edge in the pattern, a signal processing unit for converting the beam position data to an equivalent time for positioning the laser beam along the scan line during scanning, and converting this equivalent time to an integer number of clock pulses plus a fractional remainder, digital counting means for generating a timing pulse at a time corresponding to the integer number of clock pulses and a time delay circuit for incurring to the timing pulse a time delay equal to the fractional remainder, and a circuit for setting the modulator input signal to the digital beam intensity data at the arrival of the timing pulse.

16. A method for writing on a photosensitive surface a pattern described in input data by scanning at least one modulated laser beam in parallel scan lines while moving along scan stripes in a direction perpendicular to the scan lines, the method comprising the steps of dividing said input data into partially overlapping stripe pattern data corresponding to scan stripes having stripe overlap regions, providing a predetermined exposure blend function along the scan line, said blend function starting and ending with a 0% value and further having a 100% value near the center of the scan line and intermediate values in the stripe overlap regions, and modulating the laser beam with the product of the exposure blend function and the stripe pattern data.

17. A method as set forth in claim 16, wherein the exposure blend function has two or more intermediate values.

18. A method as set forth in claim 17, wherein the shape of the exposure blend function is software-controlled and can be changed by the operator.

19. A method as set forth in claim 16, wherein the stripe overlap has a width that is software-controlled and can be changed by the operator.

20. A method as set forth in claim 16, wherein for each laser beam the exposure blend function and the stripe pattern data are combined into a single modulation signal and fed to a single modulator.

21. A method as set forth in claim 20, wherein the data fed to the modulator is applied with pattern-dependent time delays, and further wherein transitions between different values in the exposure blend signal occurring close in time to transitions in the stripe pattern data are synchronized to the timing of the stripe pattern data.

22. A method as set forth in claim 21, wherein the stripe pattern data is at least one clock cycle wider than the region where the exposure blend function is non-zero.

23. A method as set forth in claim 21, wherein a congestion detector monitors the time delay data to indicate when two transitions in the modulator signal occur less than one clock cycle apart, and to change the timing of one of the transitions.

24. A method as set forth in claim 20, wherein the combination is done by table lookup, and the table lookup is calibrated by measurement of laser beam power.

25. An apparatus for writing patterns described in input data by scanning at least one modulated laser beam in parallel scan lines while moving along scan stripes in a direction perpendicular to the scan lines, the apparatus comprising:

a data preprocessing system for converting the input data to pattern modulation data corresponding to the patterns in partially overlapping stripes, wherein the scan stripes have stripe overlap regions, a digitally stored exposure blend function having a 0% value at the ends of the scan line, a 100% value near the center of the scan line, and intermediate values for positions corresponding to the stripe overlap regions, and modulation means for modulating the laser beam with the product of the pattern modulation data and the exposure blend function.

26. An apparatus as set forth in claim 25, further including time delay circuitry to delay transitions in the modulation data for higher address resolution than corresponding to the data clock pulses, and synchronization circuitry to synchronize transitions in the exposure blend function to delayed transitions in the pattern modulation data.

\* \* \* \* \*